US012581678B2

(12) United States Patent
Zhu

(10) Patent No.: US 12,581,678 B2
(45) Date of Patent: Mar. 17, 2026

(54) SEMICONDUCTOR DEVICE, METHOD OF MANUFACTURING THE SAME, AND ELECTRONIC APPARATUS INCLUDING THE DEVICE

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 508 days.

(21) Appl. No.: 17/661,178

(22) Filed: Apr. 28, 2022

(65) Prior Publication Data

US 2022/0352351 A1    Nov. 3, 2022

(30) Foreign Application Priority Data

Apr. 29, 2021    (CN) .......................... 202110477559.3

(51) Int. Cl.
H10D 30/01          (2025.01)
H10D 30/63          (2025.01)
          (Continued)

(52) U.S. Cl.
CPC ........... H10D 30/025 (2025.01); H10D 30/63 (2025.01); H10D 62/151 (2025.01);
          (Continued)

(58) Field of Classification Search
CPC ....... H01L 29/66666; H01L 21/823412; H01L 21/823418; H01L 29/0847; H01L 29/7827; H01L 21/2255; H01L 29/0642; H10D 30/025; H10D 30/63; H10D 62/151; H10D 84/0128; H10D 84/013; H10D 84/038;
(Continued)

(56) References Cited

U.S. PATENT DOCUMENTS 9,768,085 B1 *  9/2017  Cheng .............. H01L 29/66795
2017/0330965 A1  11/2017  Basker et al.
          (Continued)

FOREIGN PATENT DOCUMENTS

| CN | 108198815 A | 6/2018 |
| CN | 111106160 A | 5/2020 |
| CN | 111106177 A | 5/2020 |

*Primary Examiner* — Julio J Maldonado
*Assistant Examiner* — Nathan Pridemore
(74) *Attorney, Agent, or Firm* — Schwegman Lundberg & Woessner, P.A.

(57)          ABSTRACT

Provided are a semiconductor device, a method of manufacturing the semiconductor device, and an electronic apparatus including the device. According to the embodiments, the semiconductor device may include: an active region extending substantially in a vertical direction on a substrate; a gate stack formed around at least a portion of an outer periphery of a middle section of the active region in the vertical direction, wherein the active region comprises a channel region opposite to the gate stack, and a first source/drain region and a second source/drain region located on two opposite sides of the channel region in the vertical direction; a first spacer located between a conductor layer of the gate stack and the first source/drain region, and a second spacer located between the conductor layer of the gate stack and the second source/drain region.

19 Claims, 12 Drawing Sheets

(51) Int. Cl.
  *H10D 62/13*          (2025.01)
  *H10D 84/01*          (2025.01)
  *H10D 84/03*          (2025.01)

(52) U.S. Cl.
  CPC ....... *H10D 84/0128* (2025.01); *H10D 84/013* (2025.01); *H10D 84/038* (2025.01)

(58) Field of Classification Search
  CPC . H10D 62/113; H10D 64/514; H10D 84/0144
  See application file for complete search history.

(56)                     References Cited

U.S. PATENT DOCUMENTS

2019/0378761 A1* 12/2019 Xie ......................... H10D 84/85
2020/0083347 A1*  3/2020 Wang ................... H10D 30/025
2020/0350313 A1* 11/2020 Xie ...................... H10D 30/025
2021/0104440 A1*  4/2021 Miller ................. H10D 30/025
2021/0175285 A1*  6/2021 Reznicek ........... H10D 30/6728

* cited by examiner

| 1005-2 |
|:---:|
| 1003 |
| 1005-1 |
| 1001 |

SEMICONDUCTOR DEVICE, METHOD OF MANUFACTURING THE SAME, AND ELECTRONIC APPARATUS INCLUDING THE DEVICE

CROSS REFERENCE

The application claims priority of Chinese Application No. 202110477559.3 filed on Apr. 29, 2021 in the China National Intellectual Property Administration, the whole disclosure of which is incorporated herein by reference in its entirety.

TECHNICAL FIELD

The present disclosure relates to a field of semiconductor, and in particular, to a vertical semiconductor device, a method of manufacturing the vertical semiconductor device, and an electronic apparatus including such a semiconductor device.

BACKGROUND

In a horizontal device such as a Metal Oxide Semiconductor Field Effect Transistor (MOSFET), a source electrode, a gate electrode, and a drain electrode are arranged in a direction substantially parallel to a surface of a substrate. Due to such an arrangement, it is difficult to further downsize the horizontal device. In contrast, in a vertical device, a source electrode, a gate electrode, and a drain electrode are arranged in a direction substantially perpendicular to a surface of a substrate. Therefore, it is easier to downsize the vertical device compared to the horizontal device.

In addition, in the horizontal device, a spacer may be provided on two opposite sides of a gate stack in a lateral direction (i.e., two sides of the gate stack respectively facing source/drain regions opposite to each other in the lateral direction). Due to limitations of conventional spacer formation processes, it is difficult to form a spacer on two opposite sides of the gate stack in the vertical direction (i.e., both sides of the gate stack respectively facing source/drain regions opposite to each other in the vertical direction) in the vertical device.

SUMMARY

In view of the above, an object of the present disclosure is at least partially to provide a vertical semiconductor device capable of better controlling a gate length, a method of manufacturing the vertical semiconductor device, and an electronic apparatus including such a semiconductor device.

According to an aspect of the present disclosure, there is provided a semiconductor device including: an active region extending substantially in a vertical direction on a substrate; a gate stack formed around at least a portion of an outer periphery of a middle section of the active region in the vertical direction, wherein the active region comprises a first source/drain region, a second source/drain region, and a channel region, the channel region is opposite to the gate stack, and the first source/drain region and the second source/drain region are located on two opposite sides of the channel region in the vertical direction; and a first spacer and a second spacer, the first spacer is located between a conductor layer of the gate stack and the first source/drain region, and a second spacer is located between the conductor layer of the gate stack and the second source/drain region.

According to another aspect of the present disclosure, there is provided a method of manufacturing a semiconductor device, including: providing an active region extending substantially in a vertical direction on a substrate; laterally recessing a middle section of the active region in the vertical direction with respect to a lower section and an upper section of the active region in the vertical direction; forming a gate dielectric layer and a work function adjustment layer along a surface of a recess of the middle section of the active region formed with respect to the lower section and the upper section; forming a first position retaining layer in the recess in which the gate dielectric layer and the work function adjustment layer are formed; performing a selective etching on the work function adjustment layer by using the work function adjustment layer as a mask to remove a portion of the work function adjustment layer from the recess, so as to form a gap in the recess; forming a spacer along the surface of the active region, wherein the spacer fills the gap and is connected to the work function adjustment layer; removing the first position retaining layer to release a space in the recess; and forming a gate electrode material layer to fill the space.

According to another aspect of the present disclosure, there is provided an electronic apparatus including an integrated circuit formed by the semiconductor device described above.

According to embodiments of the present disclosure, a (gate) spacer is introduced in the vertical device, so that an electrical isolation distance between a gate stack, especially a conductor layer in the gate stack, and a source/drain region may be increased, and thus an increase of a parasitic capacitance may be inhibited, especially in a case where a thickness of the conductor layer is increased to reduce a resistance.

BRIEF DESCRIPTION OF THE DRAWINGS

The above and other objectives, features and advantages of the present disclosure will be more apparent through the following descriptions of embodiments of the present disclosure with reference to the accompanying drawings.

Throughout the accompanying drawings, the same or similar reference numerals indicate the same or similar components.

DETAILED DESCRIPTION OF EMBODIMENTS

Figure 1:
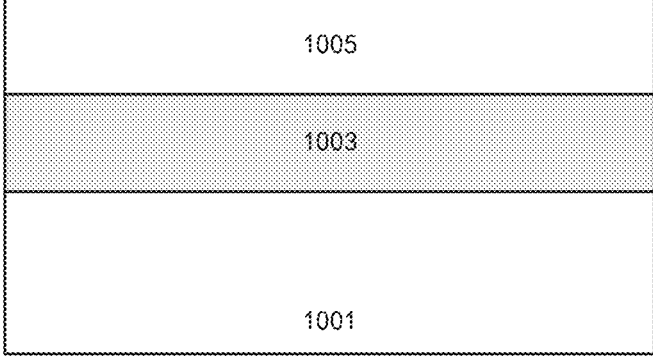
FIG. 1 to FIG. 14 show schematic diagrams of some stages in a process of manufacturing a semiconductor device according to an embodiment of the present disclosure.

The embodiments of the present disclosure will be described below with reference to the accompanying drawings. However, it should be understood that the descriptions are merely exemplary and are not intended to limit the scope of the present disclosure. In addition, in the following descriptions, descriptions of well-known structures and technologies are omitted to avoid unnecessarily obscuring the concept of the present disclosure.

Various schematic structural diagrams according to the embodiments of the present disclosure are shown in the accompanying drawings. The drawings are not drawn to scale. Some details are enlarged and some details may be omitted for clarity of presentation. Shapes of various regions and layers as well as relative sizes and positional relationships of the various regions shown in the drawings are only exemplary. In practice, there may be deviations due to manufacturing tolerances or technical limitations, and those skilled in the art may additionally design regions/layers with different shapes, sizes, and relative positions according to actual requirements.

In the context of the present disclosure, when a layer/element is referred to as being "on" another layer/element, the layer/element may be directly on the another layer/element, or there may be an intermediate layer/element between them. In addition, if a layer/element is located "on" another layer/element in one orientation, the layer/element may be located "under" the another layer/element when the orientation is reversed.

The embodiments of the present disclosure relate to a vertical semiconductor device. The "vertical" semiconductor device refers to a semiconductor device whose active region (especially a channel region) extends in a vertical direction (e.g., a direction perpendicular or substantially perpendicular to a surface of a substrate) with respect to a substrate. The active region may be formed of a single crystal semiconductor material to improve a device performance. A gate stack may be formed around (at least a portion of) an outer periphery of a middle section of the active region in the vertical direction. The channel region may be formed opposite to the gate stack in the active region, especially in the middle section of the active region. Source/drain regions may be formed on two opposite sides (i.e., an upper section and a lower section on two opposite sides of the middle section) of the active region. The source/drain regions may be electrically connected through the channel region. For example, the gate stack may include a gate dielectric layer, a work function adjustment layer, and a gate electrode material layer.

According to the embodiments of the present disclosure, a spacer may be provided between the gate stack, especially a conductor layer (e.g., the gate electrode material layer) in the gate stack, and the source/drain region. For example, the spacer may be provided on the outer periphery of the active region and on the two opposite ends of the channel region in the vertical direction. The spacer may extend along the gate stack, especially a surface of the conductor layer in the gate stack. Especially in a case where a thickness of the conductor layer in the gate stack is increased so as to reduce a resistance, the spacer may increase an interval or an electrical isolation distance between the conductor layer in the gate stack and the source/drain region, so that a parasitic capacitance may be reduced. This is because if the thickness of the conductor layer is larger, an overlap between the conductor layer and the source/drain region may be increased, thereby causing an increase of the parasitic capacitance, while the spacer may suppress the increase of the parasitic capacitance. Generally, the spacer does not extend to a surface of the gate stack facing the channel region, so as to avoid affecting a control effect of the gate stack on the channel region.

An end portion of the channel region may be defined by a doping concentration interface between the channel region and the source/drain region. For example, if a change in a doping concentration over a predetermined range (e.g., 10 nanometers) in a direction (e.g., a vertical direction) exceeds a threshold value (e.g., a magnitude of the change is 10 to 1000 times), the predetermined range may be referred to as the doping concentration interface in the direction. The "predetermined range" and the "threshold value" may be set by those skilled in the art according to actual process conditions. Moreover, the doping concentration interface is detectable. For example, the doping concentration in the direction may be detected, a change of the doping concentration in the direction may be obtained, and a place where the change of the doping concentration in a unit length in the direction is most drastic may be regarded as the doping concentration interface. In the embodiment below where the active region is formed by stacking a source/drain layer and a channel layer, the end portion of the channel region may also correspond to an end portion of the channel layer, although they may not be exactly the same.

As described below, the spacer may be formed in a self-aligned manner. Specifically, the spacer may be self-aligned to an upper end and a lower end of the channel region, respectively. The "self-alignment" here does not necessarily mean a "complete" alignment. The self-alignment refers to a relative position between structures, which is substantially unaffected by process fluctuations, particularly lithographic fluctuations. Such a self-aligned structure is detectable. For example, a plurality of devices may exist in an integrated circuit (IC), if the devices are of the self-aligned structure, a positional relationship of the spacers in each device with respect to the end portion of the channel region may remain substantially unchanged; and if the devices are not of the self-aligned structure, there may be process fluctuations between the relative positional relationship of the devices.

Similar to a spacer extending substantially in the vertical direction in a horizontal device, the spacer according to the embodiments of the present disclosure may include a portion extending in a lateral direction. Here, the "self-alignment" refers to that a laterally extended portion of the spacer is self-aligned to two ends of the channel region. The spacer may include a lower spacer self-aligned with a lower end of the channel region and an upper spacer self-aligned with an upper end of the channel region. Certainly, according to a formation process, the spacer may further include a vertically extended portion. The vertically extended portion may extend from the laterally extended portion (i.e., the end portion of the channel region) in a direction away from the gate stack. For example, a vertically extended portion (if any) of the upper spacer may extend upwardly from the laterally extended portion of the upper spacer, and a vertically extended portion (if any) of the lower spacer may extend downwardly from the laterally extended portion of the lower spacer.

According to the embodiments of the present disclosure, in order to ensure a consistency of the device performance, the gate dielectric layer and the work function adjustment layer may be formed before the spacer is formed, so that they may uniformly face the channel region (including the end portion of the channel region), and it may be ensured that they have substantially uniform characteristics such as a threshold voltage (Vt) in a direction of an entire channel length. For example, an end portion of the gate electrode material layer on a side close to the active region may include a first surface of a lower portion, a second surface of an upper portion, and a third surface facing the channel region, and the work function adjustment layer may cover at least the third surface. Then, on a side of the gate stack facing the channel region, it is the work function adjustment layer (plus the gate dielectric layer) which faces the channel region, which may facilitate the consistency of the device performance.

In this case, the spacer may be interposed in the gate stack, and for example, the spacer may extend on a surface of the gate electrode material layer. According to the embodiments, a position of the spacer, particularly the laterally extended portion of the spacer, may be defined by the work function adjustment layer. Therefore. (the laterally extended portion of) the spacer may extend from an end portion of the work function adjustment layer and (the vertically extended portion of the spacer) may further extend to a surface of the source/drain region. For example, the spacer may be connected to the work function adjustment layer on a first surface and a second surface of the gate electrode material layer and extend from a connection point of the spacer and the work function adjustment layer. Due to the self-aligned process, portions of the spacer on the first surface and the second surface may be aligned with the work function adjustment layer. For example, the spacer and the work function adjustment layer may have substantially the same thickness, or at least one of the upper surfaces and the lower surfaces of the both spacer and the work function adjustment layer may be substantially coplanar.

According to the embodiments of the present disclosure, the middle section of the active region may be recessed laterally with respect to the lower section and the upper section of the active region, which may facilitate the self-aligned process. In this case, the work function adjustment layer may be provided in a recess formed by the middle section with respect to the lower section and the upper section, and an end portion of the gate electrode material layer on a side close to the active region may be embedded in the recess. The work function adjustment layer may completely cover at least a surface of the end portion of the gate electrode material layer facing the channel region. For example, a lower end of the end portion of the gate electrode material layer in the vertical direction may be recessed toward an upper side with respect to a lower end of the work function adjustment layer in the vertical direction, and an upper end of the end portion of the gate electrode material layer in the vertical direction may be recessed toward a lower side with respect to an upper end of the work function adjustment layer in the vertical direction. The conductor layer (including the work function adjustment layer and the gate electrode material layer) in the gate stack may be T-shaped, with a top end of the T shape facing the channel region.

According to the embodiments of the present disclosure, the active region may be formed by sequentially stacking a first source/drain layer (the "lower section" described above), a channel layer (the "middle section" described above), and a second source/drain layer (the "upper section" described above). The layers may be adjoined, and there may be other semiconductor layers between the layers, such as a leakage suppression layer, and an on-current enhancement layer (a semiconductor layer with a bandgap larger or smaller than a bandgap of an adjacent layer). The source/drain region may be substantially formed in the first source/drain layer and the second source/drain layer, and the channel region may be substantially formed in the channel layer. The gate stack may be self-aligned to the channel layer, and (the laterally extended portion of) the spacer may be self-aligned to the channel layer. A gate length may be determined by a thickness of the channel layer. The channel layer may be formed by, for example, an epitaxial growth so that a thickness of the channel layer may be well controlled. Therefore, the gate length may be well controlled.

For example, the first source/drain layer may be a semiconductor substrate. In this case, the channel layer may be a semiconductor layer epitaxially grown on the substrate, and the second source/drain layer may be a semiconductor layer epitaxially grown on the channel layer. Alternatively, the first source/drain layer may be a semiconductor layer epitaxially grown on the substrate. In this case, the channel layer may be a semiconductor layer epitaxially grown on the first source/drain layer, and the second source/drain layer may be a semiconductor layer epitaxially grown on the channel layer. A crystalline interface may exist between separately grown semiconductor layers. The channel layer may have an etching selectivity with respect to the first source/drain layer and the second source/drain layer in order to easily achieve a relative recessing of the middle section.

Such a semiconductor device may be manufactured, for example, as follows.

A vertical active region may be provided on the substrate with the middle section of the active region relatively recessed. A spacer defining layer may be formed on the surface of the active region in a substantially conformal manner, and then a first position retaining layer may be formed in a recess thus formed. A selective etching may be performed on the spacer defining layer with the first position retaining layer as a mask to remove at least a portion of the laterally extended portion of the spacer defining layer to form a gap in the recess. Then, a spacer is formed through a spacer forming process. At the time the spacer is formed, a spacer material may enter the gap described above, so as to form a laterally extended portion of the spacer.

Next, a replacement gate process may be performed to form a gate stack. For example, the first position retaining layer may be removed (optionally, the spacer defining layer may be removed, and whether the spacer defining layer is removed or not depends on a material of the spacer defining layer; for example, in case that the spacer defining layer is formed by the work function adjustment layer, the spacer defining layer does not need to be removed), so as to release a space in the recess. The gate stack may be formed with an end portion of the gate stack embedded in the recess.

A source/drain region may be formed in the lower section and the upper section of the active region. For example, this may be realized by doping the lower section and the upper section of the active region. For example, ion implantation and plasma doping may be performed, or in situ doping may be performed while the first source/drain layer and the second source/drain layer are grown. According to an advantageous embodiment, a second position retaining layer may be formed in the recess described above, a dopant source layer may be formed on the surface of the active region, and a dopant in the dopant source layer may be driven into the active region by, for example, annealing. The second position retaining layer may prevent the dopant in the dopant source layer from directly entering the middle section (the channel region) of the active region. However, there may be a portion of the dopant entering the upper end and the lower end of the middle section via the upper section and the lower section, respectively. This may facilitate reducing a resistance between the source/drain region and the channel region when the device is turned on so as to improve device performance.

The present disclosure may be presented in various forms, some examples of which are described below.

FIG. 1 to FIG. 14 show schematic diagrams of a process of manufacturing a semiconductor device according to an embodiment of the present disclosure.

As shown in FIG. 1, a substrate 1001 is provided. The substrate 1001 may be a substrate of various forms, including but not limited to a bulk semiconductor material substrate such as a bulk Si substrate, a semiconductor-on-insulator (SOI) substrate, a compound semiconductor substrate such as a SiGe substrate, and the like. In the following descriptions, for ease of explanation, the bulk Si substrate is illustrated by way of example.

A channel layer 1003 and another semiconductor layer 1005 may be sequentially formed by, for example, epitaxial growth on the substrate 1001. The channel layer 1003 may be used to define a position of a channel region, and a thickness of the channel layer 1003 may correspond to a desired gate length of, for example, about 10 nm to 100 nm. The semiconductor layer 1005 may be used to define a position of an upper source/drain region, and a thickness of the semiconductor layer 1005 is, for example, about 30 nm to 100 nm. Each layer grown on the substrate 1001 may be a single crystalline semiconductor layer, and there may be etching selectivity between adjacent layers. For example, the channel layer 1003 may contain SiGe (with an atomic percentage of Ge of, for example, about 10% to 40%), and the semiconductor layer 1005 may contain Si.

Figure 2A:
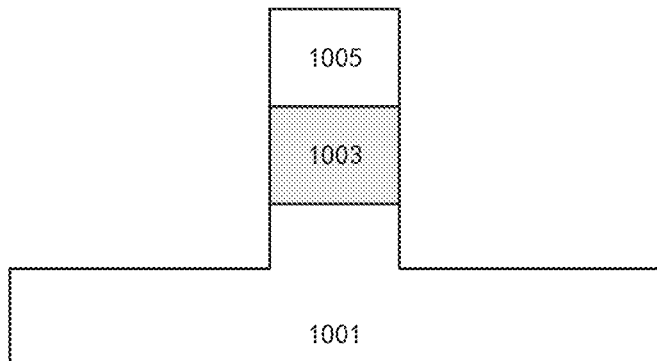
Figure 2B:
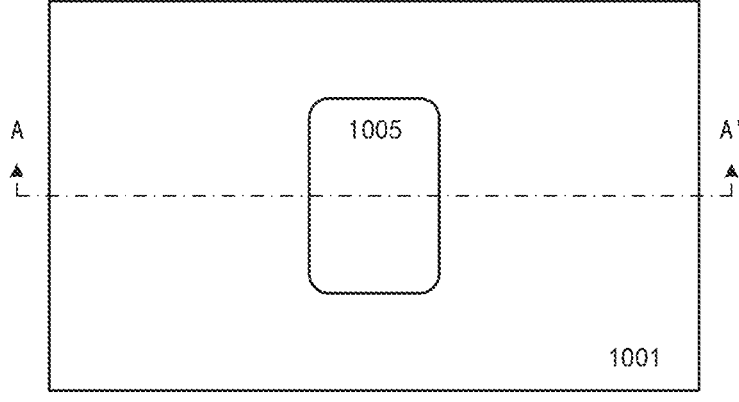

Next, an active region of the device may be defined. This may be performed, for example, as follows. Specifically, as shown in FIG. 2(*a*) and FIG. 2(*b*) (FIG. 2(*a*) is a cross-sectional view. FIG. 2(*b*) is a top view, in which line AA' shows a position where the cross section is taken), a photoresist (not shown) may be formed on a stack of the substrate 1001, the channel layer 1003, and the semiconductor layer 1005 shown in FIG. 1, the photoresist may be patterned into a desired shape (in the example, a rounded rectangle with a short side of, for example, about 10 nm to 30 nm) by photolithography (exposure and development), and a selective etching such as Reactive Ion Etching (RIE) may be performed on the semiconductor layer 1005, the channel layer 1003, and the substrate 1001 sequentially with the patterned photoresist as a mask. The etching may proceed into the substrate 1001, but not to a bottom surface of the substrate 1001. Thus, the semiconductor layer 1005, the channel layer 1003, and an upper portion of the substrate 1001 after the etching form a column. The RIE may, for example, be performed in a direction substantially perpendicular to a surface of the substrate, so that the column is also substantially perpendicular to the surface of the substrate. After that, the photoresist may be removed.

In this way, the active region of the semiconductor device (the upper portion of the substrate 1001, the channel layer 1003, and the semiconductor layer 1005 after the etching) is defined. In the example, the active region is substantially columnar. It should be noted that the shape of the active region may be changed due to a subsequent process, but may still be vertically columnar as a whole.

Certainly, the shape of the active region is not limited to this, and other shapes may be formed according to a design layout. For example, in the top view, the active region may be circular (e.g., with a diameter of about 10 nm to 30 nm), square (e.g., with a side length of about 10 nm to 30 nm), and the like, or may be polygonal in order to optimize a device performance such as a mobility, and the like.

Figure 3:
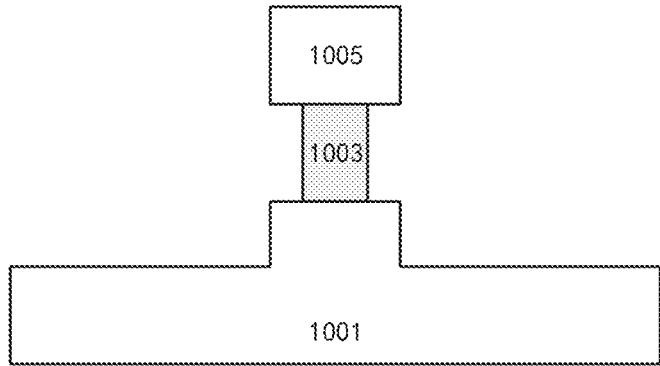

As shown in FIG. 3, in order to facilitate performing a self-alignment process, an outer periphery of the channel layer 1003 may be recessed (in the example, recessed in a lateral direction substantially parallel to the surface of the substrate) with respect to an outer periphery of the substrate 1001 and an outer periphery of the semiconductor layer 1005. This may be realized by, for example, further selectively etching the channel layer 1003 with respect to the substrate 1001 and the semiconductor layer 1005. A recess thus formed may be self-aligned to the channel layer 1003. Atomic Layer Etching (ALE) may be used in order to better control an etching depth. According to the example, the channel layer 1003 (here, SiGe) may be modified by using hydrogen (H) and/or helium (He), and the modified layer may then be removed by wet etching or a group of $NH_3$, $NF_3$, or the like. Such processing may be repeated until a desired etching depth is realized.

Alternatively, for example, a heat treatment may be performed, so that the surface of the substrate 1001, a surface of the channel layer 1003, and a surface of the semiconductor layer 1005 may be oxidized, and surface oxide layers of the substrate, the channel layer and the semiconductor layer may then be removed. In a case where the channel layer 1003 contains SiGe and the substrate 1001 and the semiconductor layer 1005 contain Si, an oxidation rate of SiGe is higher than an oxidation rate of Si, and an oxide on SiGe is easier to be removed. Steps of oxidation-oxide removal may be repeated to realize the desired etching depth.

Figure 4:
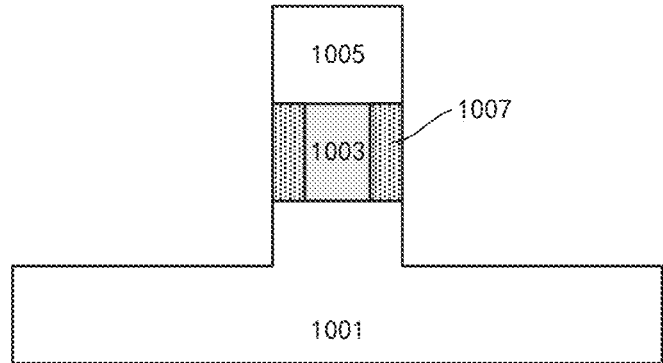

A gate stack may be subsequently formed in the recess formed by the channel layer 1003 with respect to the upper portion of the substrate 1001 and the outer periphery of the semiconductor layer 1005. In order to avoid a subsequent processing from affecting the channel layer 1003 or leaving an unnecessary material in the recess so as to affect a subsequent formation of the gate stack, a material layer may be filled in the recess to occupy a space of the gate stack (thus, the material layer may be referred to as a "position retaining layer" or a "sacrificial gate"). For example, this may be realized by depositing a nitride (e.g., silicon nitride) on a structure shown in FIG. 3, and then etching back the deposited nitride by, for example, RIE. As shown in FIG. 4, the RIE may be performed in the direction substantially perpendicular to the surface of the substrate so that the nitride may be remained substantially only within the recess to form a position retaining layer 1007. In this case, the position retaining layer 1007 may substantially fulfill the recess described above.

Next, source/drain regions may be formed in the substrate 1001 and the semiconductor layer 1005. This may be formed by doping the substrate 1001 and the semiconductor layer 1005. This may be performed, for example, as follows.

Figure 5:
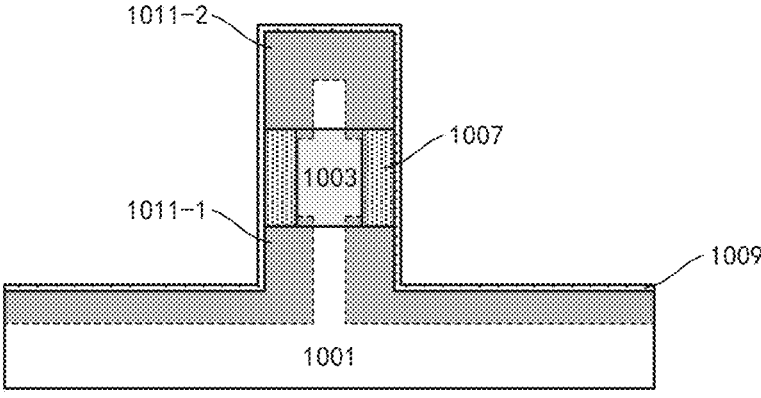

Specifically, as shown in FIG. 5, a dopant source layer 1009 may be formed on the structure shown in FIG. 4. For example, the dopant source layer 1009 may contain an oxide such as silicon oxide, in which a dopant is contained. For an n-type device, an n-type dopant may be contained, and for a p-type device, a p-type dopant may be contained. Here, the dopant source layer 1009 may be a thin film, and thus may be deposited substantially conformally on a surface of the structure shown in FIG. 4 by, for example, Chemical Vapor Deposition (CVD) or Atomic Layer Deposition (ALD). Next, the dopant contained in the dopant source layer 1009 may be driven into the active region by, for example, annealing, so as to form a doped region in the active region, as shown by a shaded portion in FIG. 5. More specifically, a source/drain region 1011-1 may be formed in the substrate 1001 and the other source/drain region 1011-2 may be formed in the semiconductor layer 1005. After that, the dopant source layer 1009 may be removed.

In FIG. 5, a front of the doped region, which may be used to define an interface between the source/drain region and other regions (e.g., the channel region, which may be lightly doped or not intentionally doped), is schematically shown in dashed lines. For example, in an example, the interface may be defined by a doping concentration of about 5E18 cm$^{-3}$ to 1E19 cm$^{-3}$. In the following drawings, the source/drain region is not shown shaded for clarity, and only a boundary of the source/drain region is schematically shown in dashed lines.

In addition, although the position retaining layer 1007 is present, the dopant may enter the channel layer 1003 through the substrate 1001 and the semiconductor layer 1005, so as to form a certain doping profile at both upper and lower ends of the channel layer 1003, in particular, form a certain overlap with both upper and lower ends of the position retaining layer 1007, respectively. The doping profile (which may form an extension region, and may also be used to as a portion of the source/drain region) may reduce a resistance between the source/drain regions when the device is turned on, so as to improve the device performance. Since the doping is performed substantially equally at both the upper end and the lower end, a degree of the doping profile into the channel layer 1003 may be substantially the same at the upper and lower ends of the channel layer 1003.

In the above example, the source/drain region is formed by driving in the dopant from the dopant source layer into the active region. However, the present disclosure is not limited to this. For example, the source/drain region may be formed by ion implantation, plasma doping (e.g., conformal doping on the surface of the structure in FIG. 4), and the like. Alternatively, in the processing described above in combination with FIG. 1, a well region may be formed in the substrate 1001, the channel layer 1003 may be grown on the well region, and then the semiconductor layer 1005 may be doped in situ while being grown on the channel layer 1003. The channel layer 1003 may also be doped in situ while being grown, so as to adjust a threshold voltage (Vt) of the device.

In the example, the dopant source layer 1009 includes a portion that extends on a horizontal surface of the substrate 1001 so that the doped region formed in the substrate 1001 extends beyond an outer periphery of the columnar active region. In this way, the source/drain region 1011-1 may be easily electrically connected through the doped region in a subsequent process.

In addition, a surface of the source/drain region may be silicided to reduce a contact resistance. For example, a metal such as NiPt (with a content of Pt of about 1% to 10%) (not shown) may be deposited on the structure (the dopant source layer 1009 is removed) shown in FIG. 5, and then annealing is performed at a temperature of, for example, about 200° C. to 600° C., so that the metal is reacted with a semiconductor element such as Si in the active region to form a silicide (here, SiNiPt) layer (not shown). After that, the metal remaining unreacted may be removed.

Figure 6:
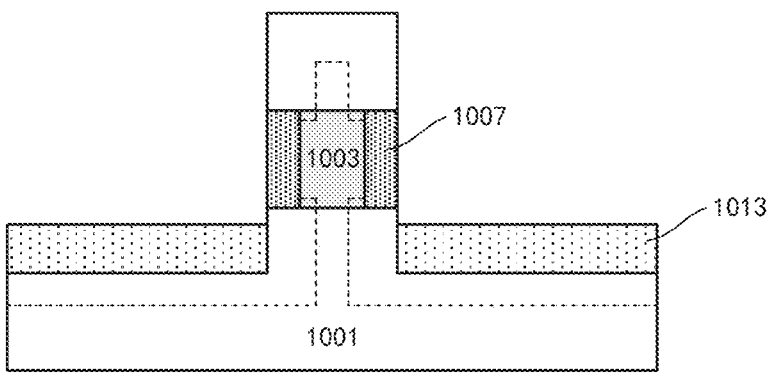

An isolation layer may be formed around the active region to realize an electrical isolation. For example, as shown in FIG. 6, an oxide (e.g., silicon oxide) may be deposited on the structure shown in FIG. 5 (with the dopant source layer 1009 being removed) and etched back by, for example, RIE, so as to form an isolation layer 1013. A planarization processing such as Chemical Mechanical Polishing (CMP) or sputtering may be performed on the deposited oxide prior to the etching back. In a conventional process, in order to reduce an overlap between a gate stack subsequently formed on the isolation layer 1013 and the source/drain region 1011-1, a top surface of the isolation layer 1013 is generally set to be higher than a top surface of the source/drain region 1011-1 or a bottom surface of the channel layer 1003. In contrast, according to the embodiments of the present disclosure, the top surface of the isolation layer 1013 may be lower than the top surface of the source/drain region 1011-1 or the bottom surface of the channel layer 1003. This may increase a thickness of the conductor in the gate stack and thus reduce a resistance.

The position retaining layer 1007 may be retained when forming the isolation layer to avoid a material of the isolation layer from entering the recess described above in which the gate stack is to be accommodated. After that, the position retaining layer 1007 may be removed to release a space in the recess. For example, the position retaining layer 1007 (nitride) may be selectively etched with respect to the isolation layer 1013 (oxide) as well as the semiconductor layer 1005, the substrate 1001 (Si), and the channel layer 1003 (SiGe).

A gate stack may be formed in the released recess. According to the embodiments of the present disclosure, a formation of a spacer may be combined when the gate stack is formed.

Figure 7:
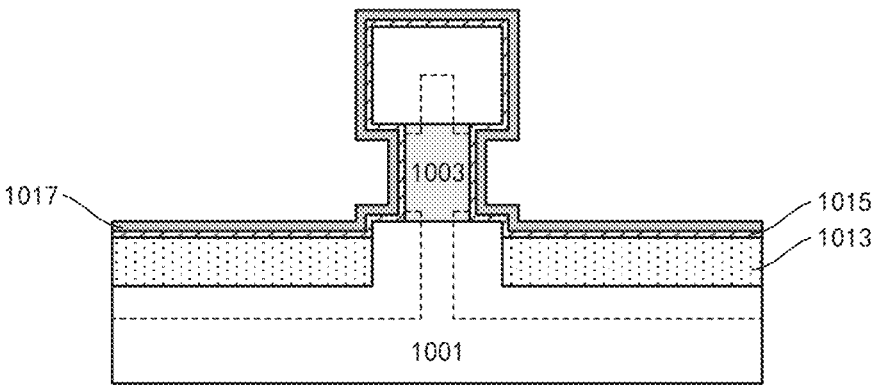

As shown in FIG. 7, a gate dielectric layer 1015 and a work function adjustment layer 1017 may be sequentially formed on a structure shown in FIG. 6 (with the position holding layer 1007 being removed) by, for example, deposition. The gate dielectric layer 1015 and the work function adjustment layer 1017 may be formed in a substantially conformal manner, so as to extend on a surface of the structure. For example, the gate dielectric layer 1015 may contain a high-K gate dielectric such as HfO$_2$ with a thickness of about 1 nm to 5 nm; the work function adjustment layer 1017 may contain a material having a suitable work function (in combination with the gate dielectric layer 1015), such as a conductive metal nitride, e.g., TiN, with a thickness of about 1 nm to about 10 nm. In addition, an interface layer (not shown) of, for example, an oxide with a thickness of about 0.3 nm to 1.5 nm, may also be formed prior to forming the gate dielectric layer 1015.

In a conventional process, a gate electrode material layer may be formed directly on the work function adjustment layer 1017, and thus a gate stack may be formed. According to the embodiments of the present disclosure, a spacer may be formed. In general, the spacer may be formed on two opposite sides (upper and lower sides in the case of the vertical device) of the gate facing the source/drain region, respectively, and are not desirably formed on a side of the gate facing the channel region. A formation space of the spacer may be defined by the work function adjustment layer 1017 in combination with the position retaining layer formed in the recess.

Figure 8:
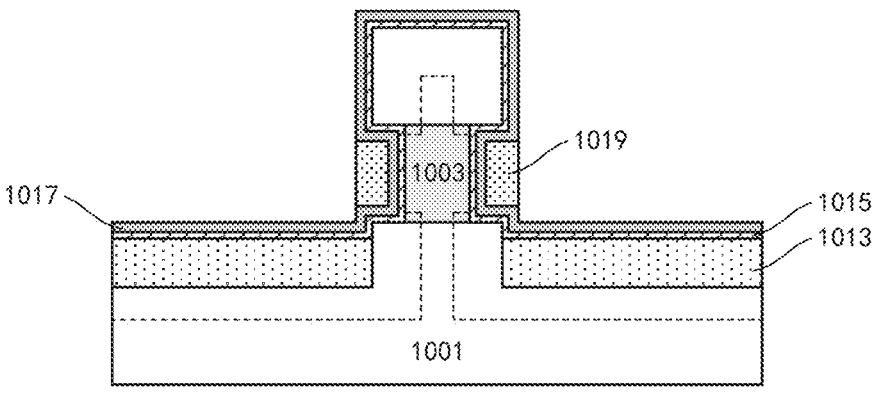
Figure 9:
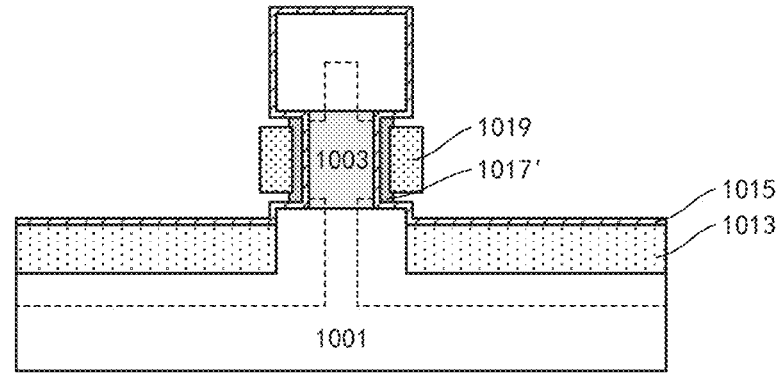

For example, as shown in FIG. 8, another position retaining layer 1019 may be formed in the recess as described above in combination with FIG. 3 and FIG. 4. Taking into account the etching selectivity, the position retaining layer 1019 may contain, for example, SiC. Then, as shown in FIG. 9, the work function adjustment layer 1017 may be etched by selective etching with the position retaining layer 1019 as a mask. For the etching of the work function adjustment layer 1017, spaces on the upper and lower sides of the position retaining layer 1019 may be released, and a portion of the work function adjustment layer 1017 facing the channel region (in this example, a portion extending on the surface of the channel layer 1003) may be retained. In order to ensure a process margin, a portion of the retained work function adjustment layer 1017' extends to upper and lower surfaces of the position retaining layer 1019 in addition to a portion extending on the surface of the channel layer 1003. Since the etching is performed substantially equally on the upper and lower sides, lengths of the work function adjust- ment layer 1017' extending on the upper and lower surfaces of the position retaining layer 1019 may be substantially the same. Here, ALE may be used in order to better control an amount of the etching.

Figure 10:
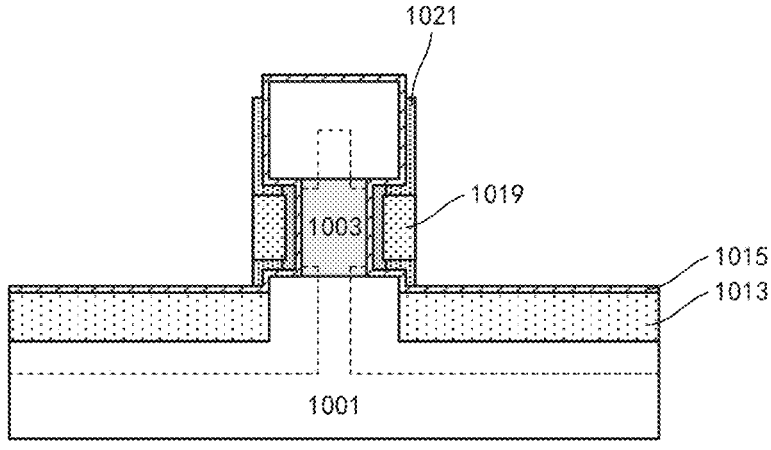

After that, a spacer may be formed through a spacer forming process. For example, as shown in FIG. 10, a thin spacer material layer may be formed by deposition, such as CVD or ALD. Taking into account the etching selectivity (e.g., with respect to the position retaining layer 1019, the gate dielectric layer 1015, and the like), the spacer material layer may contain a nitride or an oxide. The spacer material layer may be formed in a substantially conformal manner, and a deposition thickness may cause the deposited spacer material layer to fulfill the spaces on the upper and lower sides of the position retaining layer 1019. Then, an aniso- tropic etching such as RIE may be performed on the depos- ited spacer material layer. RIE may be performed in the vertical direction, and the amount of the etching may be greater than the deposition thickness, so that a laterally extended portion (not covered by the position retaining layer 1019) of the spacer material layer may be removed, while most of the vertically extended portion of the spacer material layer may be retained. In addition, due to an existence of the position retaining layer 1019, portions of the spacer material layer extending on the upper and lower sides of the position retaining layer 1019 may be retained (although they are extended laterally). The retained spacer material layer may form a spacer 1021.

The portions of the spacer 1021 on the upper and lower sides of the position retaining layer 1019 may occupy the space of the work function adjustment layer 1017 (thus a thickness of the spacer 1021 is substantially the same as the thickness of the work function adjustment layer 1017, and they may be substantially coplanar; for example, upper surfaces of the spacer and the work function adjustment layer are coplanar and/or lower surfaces of the spacer and the work function adjustment layer are coplanar), and thus may be self-aligned to the work function adjustment layer 1017'. In addition, the work function adjustment layer 1017' may be self-aligned to the channel layer 1003 (and, thus, to the channel region formed in the channel layer 1003), so that the portions of the spacer 1021 on the upper and lower sides of the position retaining layer 1019 may be self-aligned to the upper and lower ends of the channel region.

In this example, the spacer 1021 on the upper and lower sides of the position retaining layer 1019 also extend upwardly and downwardly, respectively, so as to surround a corner caused by the formation of the recess in the active region. This may improve a device reliability, e.g., reducing an electrical breakdown, reducing a parasitic capacitance, and the like.

Figure 11:
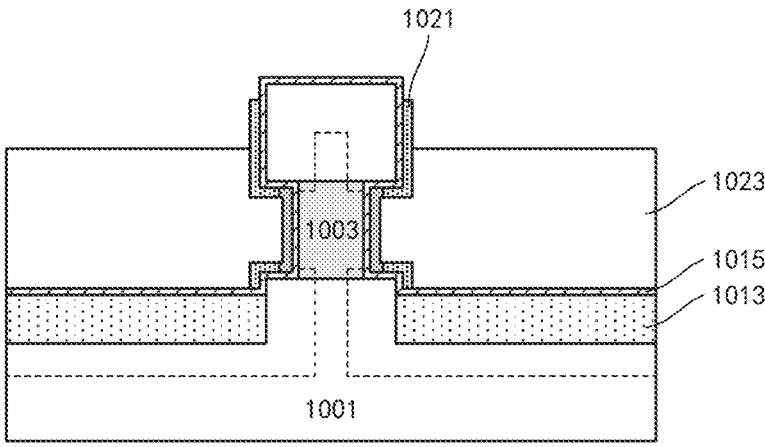

The position retaining layer 1019 may be removed after the spacer 1021 is formed in this way, and a gate electrode material layer 1023 may be formed on the isolation layer 1013, as shown in FIG. 11. For example, the gate electrode material layer 1023 may be formed by depositing a conduc- tive material such as a metal and etching back the deposited conductive material. In a conventional process, in order to reduce an overlap between the gate stack and the source/ drain region 1011-2, a top surface of the gate electrode material layer 1023 (outside the recess) is generally etched back to be lower than a bottom surface of the source/drain region 1011-2 or a top surface of the channel layer 1003. In contrast, according to the embodiments of the present dis- closure, the top surface of the gate electrode material layer 1023 (outside the recess) may be higher than the bottom surface of the source/drain region 1011-2 or the top surface of the channel layer 1003, which may increase the thickness of the conductor in the gate stack and thus reduce the resistance. Meanwhile, although an overlap exists between the conductor in the gate stack and the source/drain region, a separation between the conductor and the source/drain region is increased due to the existence of the spacer 1021, so that the increase of the parasitic capacitance may be inhibited.

As shown in FIG. 11, an end portion of the gate stack may be embedded in the recess, and may be self-aligned to the channel layer 1003. In addition, the work function adjust- ment layer 1017' completely covers a surface of the gate electrode material layer 1023 facing the channel region. Thus, the conductor (1017' plus 1023) in the gate stack may have a T-shape on a side close to the channel layer 1003, an a top end of the T shape faces the channel.

Figure 12:
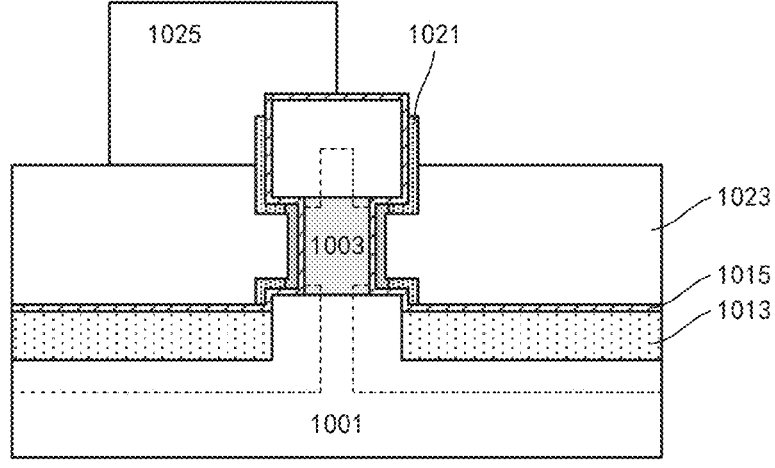

Next, a shape of the gate electrode material layer 1023 may be adjusted to facilitate a subsequent interconnect manufacture. For example, as shown in FIG. 12, a photo- resist 1025 may be formed on a structure shown in FIG. 11. The photoresist 1019 is patterned by, for example, photoli- thography, to cover a portion (in this example, a left half in FIG. 12) of the gate electrode material layer 1023 exposed outside the recess, and to expose another portion (in this example, a right half in FIG. 12) of the gate electrode material layer 1023 exposed outside the recess.

Figure 13:
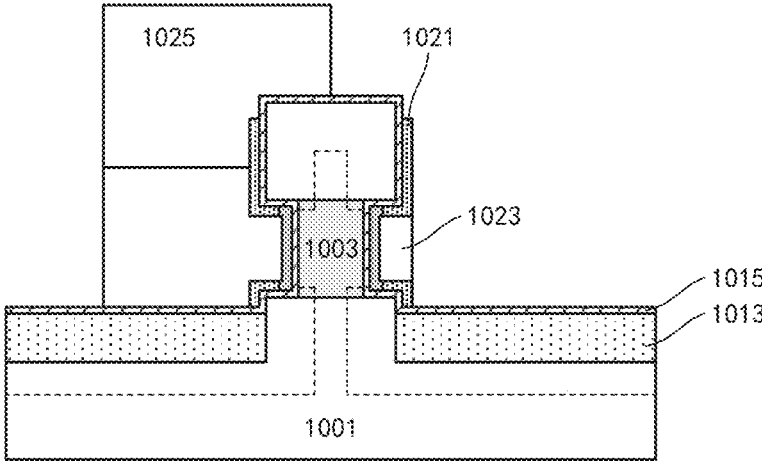

Then, as shown in FIG. 13, selective etching such as RIE may be performed on the gate electrode material layer 1023 with the photoresist 1025 as a mask. RIE may be performed in the vertical direction. In this way, a portion of the gate electrode material layer 1023 shielded by the photoresist 1025 in addition to the portion retained in the recess may be retained. Then, an electrical connection to the gate stack may be achieved through the portion shielded by the photoresist 1025, and the portion shielded by the photoresist may be referred to as a connection portion.

According to another embodiment, selective etching such as RIE may be further performed on the gate dielectric layer 1015 (not shown). After that, the photoresist 1025 may be removed.

Figure 14:
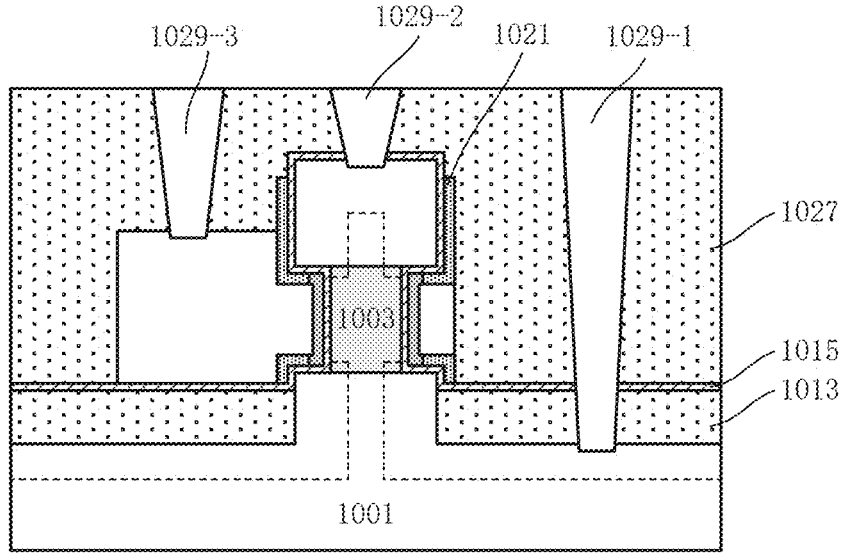

Then, as shown in FIG. 14, an interlayer dielectric layer 1027 may be formed on a structure shown in FIG. 13. For example, an oxide may be deposited and a planarization such as CMP may be performed on the oxide to form the interlayer dielectric layer 1027. A contact portion 1029-1 to the source/drain region 1011-1, a contact portion 1029-2 to the source/drain region 1011-2, and a contact portion 1029-3 to the gate electrode material layer 1023 may be formed in the interlayer dielectric layer 1027. The contact portions may be formed by etching holes in the interlayer dielectric layer 1027 and the isolation layer 1013, and filling the holes with a conductive material such as a metal.

Since the gate electrode material layer 1023 extends beyond the outer periphery of the active region, the contact portion 1029-3 to the gate electrode material layer 1023 may be easily formed. In addition, since the doped region in the substrate 1001 extends beyond the active region and there is no gate conductor layer over at least a portion of the doped region, the contact portion 1029-1 to the substrate 1001 may be easily formed.

As shown in FIG. 14, the semiconductor device according to the embodiment includes the substrate 1001, the channel layer 1003, and the semiconductor layer 1005 stacked in the vertical direction. The source/drain region 1011-1 is formed in the substrate 1001, and the source/drain region 1011-2 is formed in the semiconductor layer 1005. The channel layer 1003 may be recessed laterally, and the gate stack may be formed around the outer periphery of the channel layer 1003 and may be embedded in the recess so as to be self-aligned to the channel layer 1003 (and the channel region formed in the channel layer). It should be noted that such a lateral recess of the channel layer 1003 may not necessarily be a final form. For example, due to various process treatments (e.g., the silicidation treatment described above), the upper portion of the substrate 1001 and the semiconductor layer 1005 may be thinned such that such lateral recess may be smaller or may not even exist.

The spacer 1021 may be formed on the upper and lower sides of the gate electrode material layer 1023, and may be self-aligned to the channel layer 1003 or the two ends of the channel region formed in the channel layer 1003. In the example, the spacer 1021 may be aligned to the work function adjustment layer 1017' and may extend from an end portion of the work function adjustment layer 1017'. The spacer 1021 may increase an interval between the gate electrode material layer 1023 and the source/drain region, thereby inhibiting an increase of the parasitic capacitance.

In the above embodiments, the work function adjustment layer 1017' is used without an additional material layer to define the position of the spacer. However, the present disclosure is not limited to this.

Figure 15:
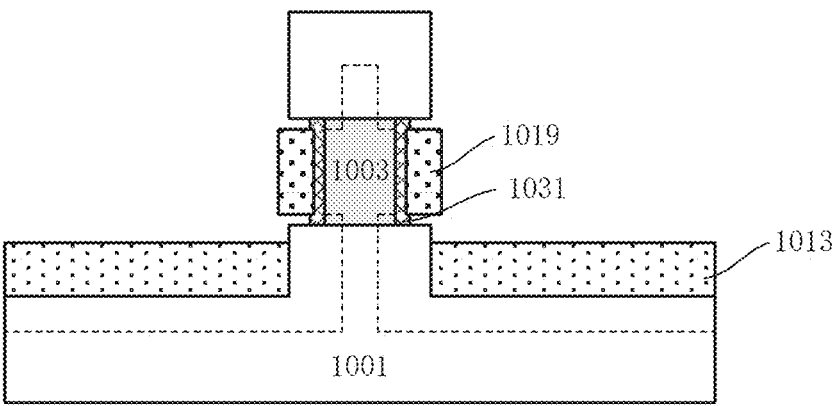
FIG. 15 to FIG. 17 show schematic diagrams of some stages in a process of manufacturing a semiconductor device according to another embodiment of the present disclosure.

For example, in the process described above in combination with FIG. 7, as shown in FIG. 15, a spacer position defining layer 1031 may be formed instead of forming the gate dielectric layer 1015 and the work function adjustment layer 1017. A formation manner of the spacer position defining layer 1031 may be similar to a formation manner of the work function adjustment layer 1017' described above. For example, the spacer position defining material layer may be formed in a substantially conformal manner, then the position retaining layer 1019 is formed in the same manner as described above, and the spacer position defining material layer is selectively etched with the position retaining layer 1019 as a mask to release the spaces on the upper and lower sides of the position retaining layer 1019, so as to obtain the spacer position defining layer 1031.

Figure 16:
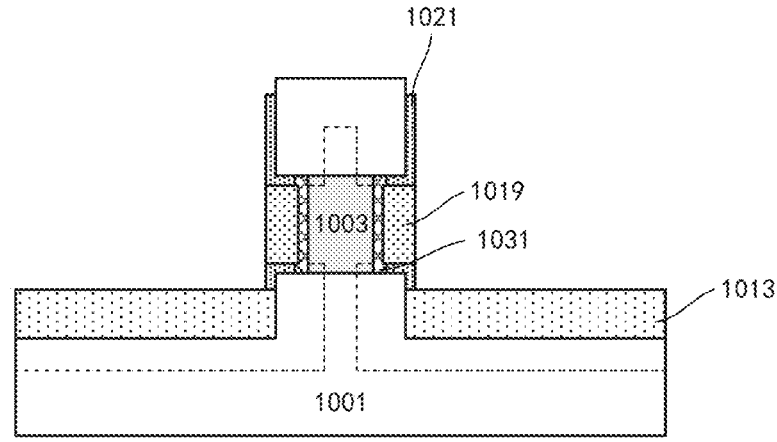
Figure 17:
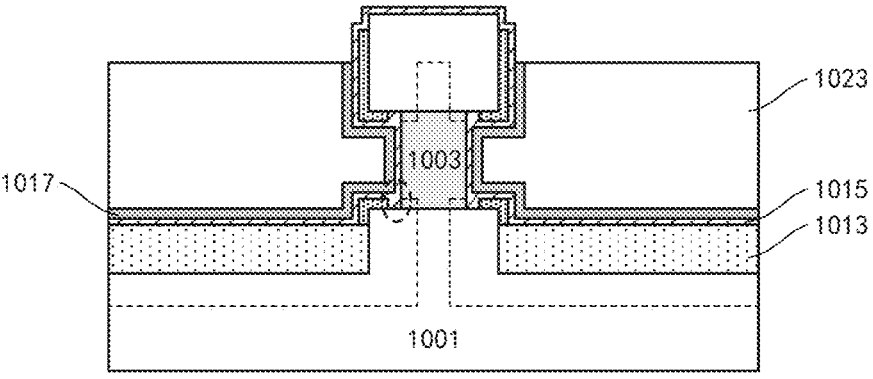

After that, as shown in FIG. 16, the spacer 1021 may be formed as described above in combination with FIG. 10. Then, the position retaining layer 1019 and the spacer position defining layer 1031 may be removed, and a gate stack may be formed on the isolation layer 1013, as shown in FIG. 17. However, in this case, as shown by a dotted circle in FIG. 17, there may be a performance fluctuation at a corner portion.

In the above embodiment, the lower source/drain region 1011-1 is formed in the substrate 1001. However, the present disclosure is not limited to this.

Figures 18, 19:
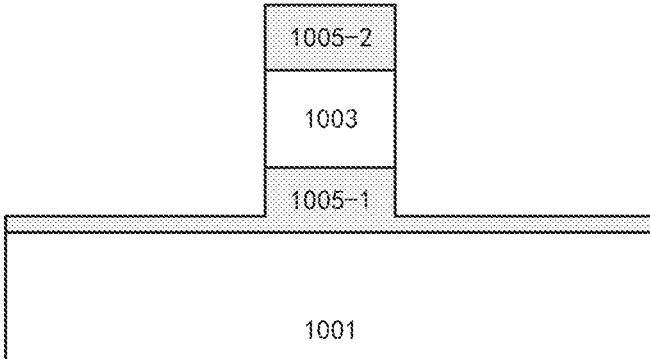
FIG. 18 to FIG. 19 show schematic diagrams of some stages in a process of manufacturing a semiconductor device according to another embodiment of the present disclosure.

For example, as shown in FIG. 18, a first source/drain layer 1005-1, a channel layer 1003, and a second source/drain layer 1005-2 may be sequentially provided on the substrate by, for example, epitaxial growth. Regarding the channel layer 1003, reference may be made to the description of the channel layer in the embodiments described above. In addition, regarding the first source/drain layer 1005-1 and the second source/drain layer 1005-2, reference may be made to the description of the semiconductor layer 1005 in the embodiments described above. The difference is that their materials may be different from those in the embodiments described above, so as to provide an etching selectivity between adjacent layers. In addition, the layers may be doped in situ while being grown to provide an appropriate doping profile.

Then, an active region may be defined as described above in combination with FIG. 2(*a*) and FIG. 2 (*b*). Here, the etching may proceed into the first source/drain layer 1005-1 as shown in FIG. 19. After that, the processing may be performed in the manner of the embodiments described above. For example, the channel layer 1003 is recessed laterally with respect to the first source/drain layer 1005-1 and the second source/drain layer 1005-2 by selective etching, and a position retaining layer is formed in the lateral recess to form a self-aligned spacer and gate stack. In a case of in situ doping, a portion of a dopant in the first source/drain layer 1005-1 and the second source/drain layer 1005-2 may be driven into two ends of the channel layer 1003 by an annealing process to form an extension region.

In the embodiments described above, the channel layer and the source/drain layer having etching selectivity with respect to each other are respectively provided, so that the selective etching may be performed and the channel layer may be recessed laterally with respect to the source/drain layer. However, the present disclosure is not limited to this.

Figure 20:
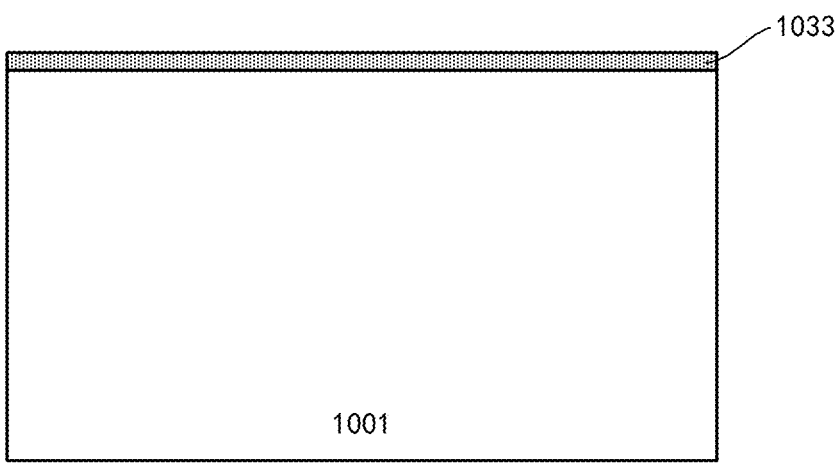
FIG. 20 to FIG. 23 show schematic diagrams of some stages in a process of manufacturing a semiconductor device according to another embodiment of the present disclosure.

For example, as shown in FIG. 20, starting from a bulk substrate 1001 (e.g., a silicon wafer), a first shield layer 1033 may be formed by, for example, deposition on a top surface of the substrate 1001.

Figure 21:
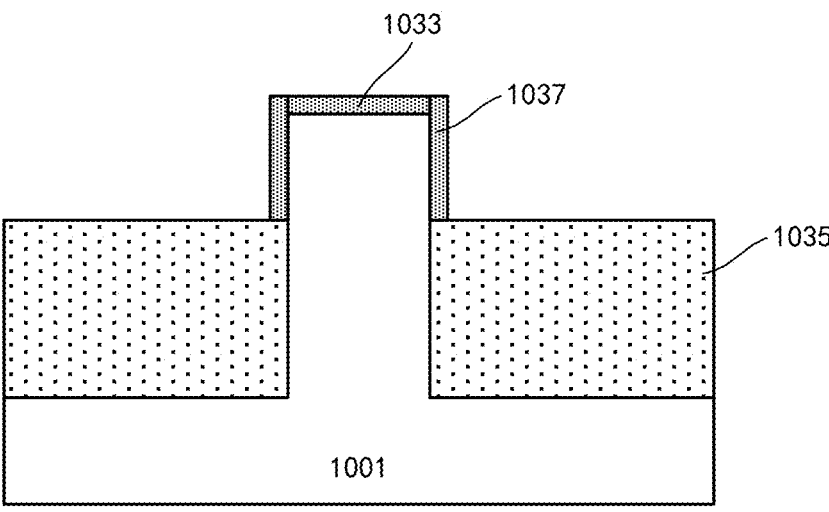
Figure 22:
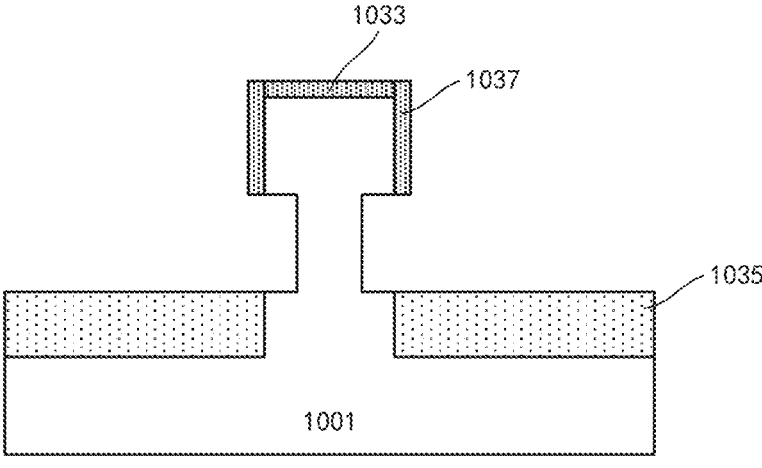

Then, an active region may be defined as described above in combination with FIG. 2(*a*) and FIG. 2 (*b*). As shown in FIG. 21, the active region may be formed as a column protruding from the substrate 1001. In order to form a lateral recess in a middle portion of the columnar active region for manufacturing a self-aligned spacer and gate stack as described above, an upper portion and a lower portion of the active region may be shielded by a shielding layer. For example, as shown in FIG. 21, a second shield layer 1035 may be formed on the substrate 1001 by depositing and then etching back (a planarization process may be performed prior to the etching back), and a third shield layer 1037 in a spacer form may be formed on the second shield layer 1035 by a spacer formation process. Then, as shown in FIG. 22, a sidewall of the middle portion of the active region may be exposed by etching back the second shield layer 1035. The exposed sidewall of the active region may be relatively recessed by lateral etching as described above. After that, the shielding layers may be removed.

Figure 23:
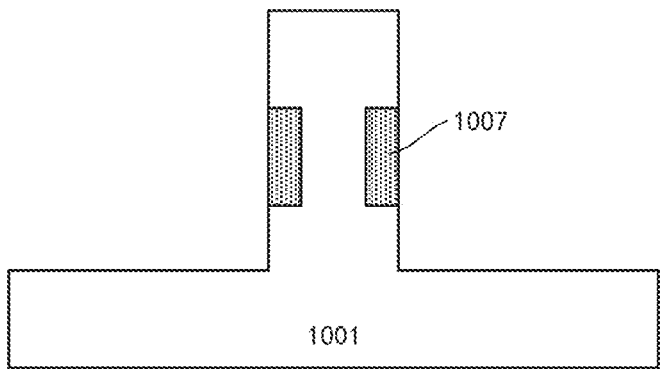

In the recess formed in this way, a position retaining layer 1007 may be formed as described above, as shown in FIG. 23. Then, the process may be performed as described above.

The semiconductor device according to the embodiments of the present disclosure may be applied to various electronic apparatuses. For example, an integrated circuit (IC) may be formed by integrating a plurality of such semiconductor devices and other devices (e.g., other forms of transistors, etc.), and an electronic apparatus may be constructed in this way. Accordingly, the present disclosure further provides an electronic apparatus including the semiconductor device described above. The electronic apparatus may further include a display screen cooperating with the integrated circuit, a wireless transceiver cooperating with the integrated circuit, and other components. The electronic apparatus may include, for example, a smart phone, a personal computer (PC), a tablet computer, an artificial intelligence apparatus, a wearable apparatus, a portable power supply, and so on.

According to the embodiments of the present disclosure, a method of manufacturing a system on chip (SoC) is further provided, which may include the method of manufacturing a semiconductor device described above. Specifically, various devices may be integrated on a chip, at least some of which are manufactured according to the method of the present disclosure.

In the above descriptions, technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the measures in the various embodiments may not be advantageously used in combination.

The embodiments of the present disclosure have been described above. However, the embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A semiconductor device, comprising:
an active region extending substantially in a vertical direction on a substrate;
a gate stack formed around at least a portion of an outer periphery of a middle section of the active region in the vertical direction, wherein the active region comprises a first source/drain region, a second source/drain region, and a channel region, the channel region is opposite to the gate stack, and the first source/drain region and the second source/drain region are located on two opposite sides of the channel region in the vertical direction; and
a first spacer and a second spacer, the first spacer is located between a conductor layer of the gate stack and the first source/drain region, and the second spacer is located between the conductor layer of the gate stack and the second source/drain region,
wherein each of the first spacer and the second spacer comprises a first portion extending substantially in a lateral direction, and a second portion extending substantially in the vertical direction from the first portion to a direction away from the gate stack;
wherein a corner formed by the first portion and the second portion of each of the first spacer and the second spacer surrounds a corner portion of the active region opposite to the gate stack;
wherein the gate stack comprises a gate dielectric layer, a work function adjustment layer, and a gate electrode material layer, and the conductor layer is the gate electrode material layer;
wherein the work function adjustment layer is respectively connected with the first spacer and the second spacer to space the conductor layer from the channel region; and
wherein the first source/drain region, the channel region and the second source/drain region are sequentially arranged in a direction away from the substrate, and the gate dielectric layer extends along a surface of the second source/drain region away from the channel region.

2. The semiconductor device according to claim 1, wherein the first spacer and the second spacer are self-aligned to two opposite ends of the channel region in the vertical direction, respectively.

3. The semiconductor device according to claim 2, wherein the first portion of the first spacer and the first portion of the second spacer are self-aligned to the two opposite ends of the channel region in the vertical direction, respectively.

4. The semiconductor device according to claim 1, wherein the first spacer and the second spacer extend from opposite end portions of the work function adjustment layer, respectively.

5. The semiconductor device according to claim 1, wherein an end portion of the gate electrode material layer close to the active region comprises a first surface on a lower side, a second surface on an upper side, and a third surface facing the active region; and
wherein the work function adjustment layer covers at least the third surface.

6. The semiconductor device according to claim 5, wherein the work function adjustment layer further respectively extends to the first surface and the second surface, the first spacer is connected to the work function adjustment layer on the first surface, and the second spacer is connected to the work function adjustment layer on the second surface.

7. The semiconductor device according to claim 6, wherein an extension length of the work function adjustment layer on the first surface is substantially equal to an extension length of the work function adjustment layer on the second surface.

8. The semiconductor device according to claim 6, wherein a thickness of a portion of the first spacer extending on the first surface and a thickness of a portion of the second spacer extending on the second surface are substantially equal to a thickness of the work function adjustment layer.

9. The semiconductor device according to claim 6, wherein a portion of the first spacer extending on the first surface has an upper surface and/or a lower surface substantially coplanar with an upper surface and/or a lower surface of a portion of the work function adjustment layer extending on the first surface; and
wherein a portion of the second spacer extending on the second surface has an upper surface and/or a lower surface substantially coplanar with an upper surface and/or a lower surface of a portion of the work function adjustment layer extending on the second surface.

10. The semiconductor device according to claim 5, wherein the gate electrode material layer comprises the end portion and a connection portion away from the gate stack with respect to the end portion, and a thickness of the connection portion in the vertical direction is greater than a thickness of the end portion in the vertical direction.

11. The semiconductor device according to claim 10, wherein at least one of the following conditions is satisfied:
a bottom surface of the connection portion is lower than the first surface of the end portion;
a top surface of the connection portion is higher than the second surface of the end portion.

12. The semiconductor device according to claim 1, wherein the middle section of the active region is recessed laterally with respect to a lower section and an upper section of the active region, the work function adjustment layer is provided in a recess formed by the middle section of the active region with respect to the lower section and the upper section, and an end portion of the gate electrode material layer close to the vertical active region is embedded in the recess.

13. The semiconductor device according to claim 12, wherein, the first spacer and the second spacer extend from a lower end of the work function adjustment layer and an upper end of the work function adjustment layer, respectively, a lower end of the end portion of the gate electrode material layer in the vertical direction is recessed toward the channel region with respect to the first spacer, and an upper end of the end portion of the gate electrode material layer in the vertical direction is recessed toward the channel region with respect to the second spacer.

14. The semiconductor device according to claim 13, wherein an extension length of the first spacer in the recess is substantially equal to an extension length of the second spacer in the recess.

15. The semiconductor device according to claim 12, wherein the first spacer and the second spacer extend from inside the recess to outside the recess along a surface of the active region.

16. The semiconductor device according to claim 1, wherein, the first source/drain region overlaps with the work function adjustment layer at a top; and the second source/drain region overlaps with the work function adjustment layer at a bottom.

17. The semiconductor device according to claim 1, wherein the active region comprises a first source/drain layer, a channel layer, and a second source/drain layer sequentially stacked, and the channel region is formed in the channel layer;

wherein the active region comprises a single crystal semiconductor material.

18. The semiconductor device according to claim 17, wherein a crystalline interface exists between the channel layer and the first source/drain layer and/or between the channel layer and the second source/drain layer;

wherein the channel layer has an etching selectivity with respect to the first source/drain layer and the second source/drain layer.

19. An electronic apparatus comprising an integrated circuit formed by the semiconductor device according to claim 1.

* * * * *